US006821709B1

(12) United States Patent
Mulligan et al.

(10) Patent No.: US 6,821,709 B1
(45) Date of Patent: Nov. 23, 2004

(54) TOP COAT LAYER FOR THERMALLY SENSITIVE PRINTING PLATES

(75) Inventors: James Laurence Mulligan, Fort Collins, CO (US); Eric Clark, Loveland, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/445,548

(22) Filed: May 27, 2003

(51) Int. Cl.[7] .................................................... G03F 7/11

(52) U.S. Cl. .................... 430/273.1; 430/138; 430/309; 430/434; 430/494; 430/944; 430/945; 101/453; 101/463.1

(58) Field of Search .............................. 430/138, 270.1, 430/271.1, 273.1, 281.1, 286.1, 302, 309, 434, 494, 944, 945; 101/453, 463.1

(56) References Cited

U.S. PATENT DOCUMENTS

| | | | | |
|---|---|---|---|---|
| 3,476,937 | A | 11/1969 | Vrancken | 250/65 |
| 5,605,780 | A | 2/1997 | Burberry et al. | 430/278.1 |
| 6,482,571 | B1 | 11/2002 | Teng | 430/302 |
| 6,548,222 | B2 | 4/2003 | Teng | 430/278.1 |
| 6,551,757 | B1 | 4/2003 | Bailey et al. | 430/270.1 |

*Primary Examiner*—Barbara Gilliam

(74) *Attorney, Agent, or Firm*—Faegre & Benson LLP

(57) ABSTRACT

The present invention provides a top coat layer for a printing plate precursor. The top coat layer includes polycyanoacrylate particles, but is substantially free of photothermal conversion material. The topcoat layer may be applied onto a thermally sensitive layer containing polycyanoacrylate particles and a photothermal conversion material. The top coat layer may reduce ablation during radiation exposure without adversely affecting printing plate performance.

44 Claims, 1 Drawing Sheet

1a
1b
1c
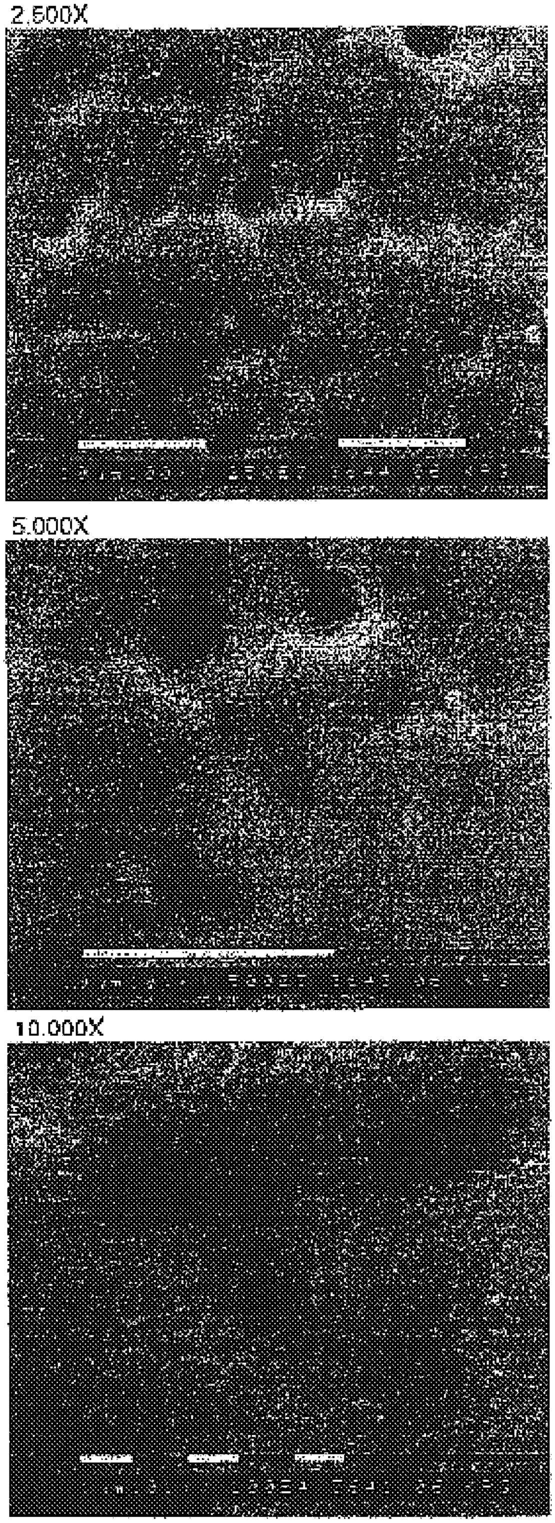
FIG. 1a-c

TOP COAT LAYER FOR THERMALLY SENSITIVE PRINTING PLATES

BACKGROUND

The art of lithographic printing is based on the immiscibility of ink and water. A lithographic printing plate is composed of ink receptive regions, commonly referred to as the "image area," generated on hydrophilic regions on a substrate. When the surface of the printing plate is moistened with water and printing ink is applied, hydrophilic regions retain the water and repel the printing ink, and the image area accepts the printing ink and repels the water. The printing ink retained on the image area may then be transferred to the surface of a material upon which the image is to be reproduced. Typically, the ink is first transferred to an intermediate blanket, which in turn transfers the ink to the desired surface.

Lithographic printing plates typically comprise a radiation-sensitive coating applied over the hydrophilic surface of a substrate. Conventional radiation-sensitive coatings include photosensitive components dispersed within an organic polymeric binder. After a portion of the coating is exposed to radiation (commonly referred to as imagewise exposure), the exposed portion becomes either more developable or less developable in a particular liquid than an unexposed portion of the coating. A printing plate is generally considered a positive-working plate if, after exposure to radiation, the exposed portions or areas of the radiation-sensitive coating become more developable and are removed in the developing process to reveal the hydrophilic surface. Conversely, the plate is considered a negative-working plate if the exposed portions or areas become less developable in the developer and the unexposed portions or areas are removed in the developing process. After being developed in a suitable liquid, the coating areas (i.e. image area) that remain on the plate provide an ink-receptive image, while the revealed regions of the substrate's hydrophilic surface repel ink.

Radiation exposure of imaging layers is generally performed using either ultraviolet, infrared ("IR") or visible radiation. IR radiation exposure (as well as other types of radiation exposure) may be advantageously utilized in an imaging technique referred to herein as "direct-write" imaging. Direct-write imaging using infrared radiation is a process in which a thermally sensitive coating of a printing plate precursor is exposed to infrared radiation from a laser source. More particularly, a computer-controlled infrared laser imagewise exposes small regions of the thermally sensitive composition to produce an image area pixel-by-pixel. Examples of plates prepared by this process are reported in U.S. Pat. No. 5,372,915 (Haley et al.). These plates include an imaging layer comprising a mixture of dissolvable polymers and an infrared radiation absorbing compound. Although the reported plates utilize direct writing techniques, the imaged plates must still be developed in an alkaline solution prior to mounting on a press.

It has further been recognized that such direct writing techniques may be utilized in the formation of "processless" printing plates. As used herein, the term "processless" refers to printing plate precursors that do not require one or more conventional processing steps (e.g. development) prior to mounting on a printing press.

One method for forming processless printing plates is through ablation of a thermally sensitive layer. For example, Canadian 1,050,805 (Eames) reports a dry planographic printing plate comprising an ink receptive substrate, an overlying silicone rubber layer, and an interposed layer containing laser energy absorbing particles (such as carbon particles) in a self-oxidizing binder (such as nitrocellulose). When such plates are exposed to focused, near-IR radiation with a laser, the absorbing layer converts the infrared energy to heat thus partially loosening, vaporizing or ablating the absorber layer and the overlying silicone rubber. Similar plates are reported in Research Disclosure 19201 (1980) as having vacuum-evaporated metal layers to absorb laser radiation in order to facilitate the removal of a silicone rubber overcoat layer. These plates are developed by wetting with hexane and rubbing. Additional patents reporting ablatable printing plates include U.S. Pat. No. 5,385,092 (Lewis et al.), U.S. Pat. No. 5,339,737 (Lewis et al.), U.S. Pat. No. 5,353,705 (Lewis et al.), U.S. Reissue 35,512 (Nowak et al.), and U.S. Pat. No. 5,378,580 (Leenders).

Ablatable printing plates have a number of disadvantages. The process of ablation tends to produce debris and vaporized materials in the image setting equipment, which must consequently be collected. Also, the laser intensity or power required for ablation may be very high, and the components of such printing plates may be expensive, difficult to use, possess a reduced life, and may produce an unacceptable printing quality.

Thermal or laser mass transfer is another method of preparing processless lithographic printing plates. Such methods are reported, for example, in U.S. Pat. No. 5,460,918 (Ali et al.) wherein a hydrophobic image is transferred from a donor sheet to a microporous hydrophilic crosslinked silicated surface of the receiver sheet. U.S. Pat. No. 3,964,389 (Peterson) reports a process of laser transfer of an image from a donor material to a receiver material requiring a high temperature post-heating step.

EP-A 0 652 483 (Ellis et al.) reports processless lithographic printing plates that are imageable using IR lasers, and that do not require wet processing prior to mounting on a press. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups.

U.S. Pat. Nos. 6,482,571 and 6,548,222 to Teng report on-press developable printing plates having a thermosensitive layer including a free radical initiator, a radiation absorbing material and a polymerizable monomer.

More recently, it has been determined that thermally sensitive coatings containing cyanoacrylate polymers may be particularly useful in the formation of processless printing plates. For example, U.S. Pat. No. 5,605,780 (Burberry et al.) reports printing plates that are imaged by an ablation method whereby exposed areas are removed using the heat generated by a focused high-intensity laser beam. The imaging layer is composed of an IR-absorbing compound in a film-forming cyanoacrylate polymer binder. In order for thermal ablation to be successful in such printing plates, the imaging later thickness is generally less than 0.1 $\mu$m and the weight ratio of IR-absorbing compound to the cyanoacrylate polymer is at least 1:1. Thus, the imaging layers are quite thin and have a significant amount of expensive IR-absorbing compound.

Additionally, U.S. patent application Ser. No. 09/864,570, filed May 24, 2001 and incorporated herein by reference reports the use of cyanoacrylate polymers in processless printing plates, in which, after exposure to infrared radiation, imaged regions may be developed "on press" by contacting an imaged thermally sensitive layer containing the cyanoacrylate polymer with aqueous fount solution.

Although the Burberry patent and U.S. application Ser. No. 09/864,570 report the benefits of using cyanoacrylate polymers in thermally sensitive layers of printing plates (e.g. ink affinity, adhesion, wear characteristics), these reported printing plates polymers may tend to suffer from certain drawbacks. One significant drawback of thermally sensitive layers that include cyanoacrylate polymers is the tendency for the thermally sensitive layer to produce ablative material upon exposure to radiation. Ablation is generally considered undesirable due to the adverse impact it may have on imagesetting equipment Furthermore, although the U.S. application Ser. No. 09/864,570 reports that conventional top coat layers may be used with thermally sensitive layers containing cyanoacrylates, conventional top coat layers may not perform suitably for use with thermally sensitive layers that include cyanoacrylate particles. More particularly, many conventional top coat layers fail to achieve a suitable balance between ablation reduction and on-press performance. For example top coat layers that are applied in solution with polar or hydrogen-bonding solvents may interact with the thermally sensitive layer to adversely impact coating integrity. More particularly, such solvents may cause the thermally sensitive layer and/or the top coat layer to lack suitable adhesion to adhere to the substrate. Furthermore, such solvents may cause the thermally sensitive layer to wash away during the application of the top coat layer.

Conversely, top coat layers that are applied in solution with non-polar solvents may be difficult to develop on press, which may lead to poor image quality. Other types of top coat layers may not suitably reduce ablation.

Thus, it would be desirable to prepare a top coat layer for application over a polycyanoacrylate-containing thermally sensitive layer that reduces ablation without adversely interacting with the thermally sensitive layer and without adversely affecting image quality.

SUMMARY OF THE INVENTION

In one embodiment, the present invention provides a top coat layer for application on a thermally sensitive layer containing polycyanoacrylate particles. The top coat layer also includes polycyanoacrylate particles, but unlike the thermally sensitive layer, the top coat layer is substantially free of photothermal conversion material. The polycyanoacrylate particles may have a major dimension between about 10 and about 600 nm. Optionally, the top coat layer may include a polymeric binder. In one embodiment, the top coat layer is applied onto the thermally sensitive layer described above to form a printing plate precursor. In this embodiment, the thermally sensitive layer includes polycyanoacrylate particles and a photothermal conversion material.

In another embodiment, the present invention provides a method of making a printing plate precursor, in which a top coat coating mixture is applied onto a thermally sensitive layer of a printing plate precursor and is then dried to form a top coat layer on the thermally sensitive layer. The top coat coating mixture generally includes a suitable carrier (e.g. a solvent that does not adversely interact with the thermally sensitive layer), polycyanoacrylate particles mixed with the carrier and optional additives. Suitable non-interactive carriers may include ethyl acetate or n-heptane, alone or in combination with each other and/or with n-propanol. As used herein, the term "coating mixture" refers to any homogeneous or heterogeneous combination or mixture of two or more materials. For example, the coating mixture may be a true solution (i.e. a dispersion at the molecular or ionic level) a dispersion, a colloidal dispersion, a slurry, a suspension, or an emulsion.

Prior to application of the top coat coating mixture, the thermally sensitive layer is applied as a thermally sensitive coating mixture onto the substrate surface, and is then dried to form the thermally sensitive layer. The thermally sensitive coating mixture generally includes a carrier, a cyanoacrylate polymer and a photothermal conversion material. This thermally sensitive carrier may be an aqueous or an organic carrier.

The thermally sensitive layer of the resulting printing plate precursor may be exposed to imagewise radiation such that radiation exposed portions of the thermally sensitive layer have a lower developability in fountain solution than unexposed portions of the layer. The top coat layer may improve ablation during imagewise radiation as compared to printing plate precursors not possessing the top coat layer. Advantageously, the thermally sensitive layer does not require the inclusion of a free-radical initiator.

Advantageously, the imaged printing plate precursor does not need to be developed in aqueous alkaline solution. Instead, the precursor may be developed "on press" by fountain solution used as part of the printing process. Such fountain solution is generally an aqueous solution with optional water-miscible organic liquids such as suitable alcohols and alcohol replacements.

BRIEF DESCRIPTION OF THE DRAWINGS

FIGS. 1*a–c* are SEM micrographs of the thermally sensitive layer of Example 1 at various levels of magnification.

DETAILED DESCRIPTION OF THE INVENTION

In one embodiment, the present invention provides a top coat layer for application onto a thermally sensitive layer of a printing plate precursor. The top coat layer includes polycyanoacrylate particles, but is substantially free of photothermal conversion material. The top coat layer may be applied onto a thermally sensitive layer of a printing plate precursor.

Examples of suitable polycyanoacrylates for the top coat layer include homopolymers derived from a single cyanoacrylate ethylenically unsaturated polymerizable monomer, copolymers derived from two or more such cyanoacrylate monomers, or polymers or copolymers derived from one or more such cyanoacrylate monomers and one or "non-cyanoacrylate" monomers or materials. Examples of suitable non-cyanoacrylate materials include ethylenically unsaturated polymerizable monomers, photothermal groups, binder groups and suitable polymerizable synthetic monomers. Where the polymers include recurring units derived from the non-cyanoacrylate monomers, at least 50 mol % of the recurring units in the polymers may be derived from one or more cyanoacrylate monomers.

Suitable additional monomers or materials that can be copolymerized with one or more cyanoacrylate monomers include, but are not limited to, acrylamides, methacrylamides, acrylates and methacrylates (for example, ethyl acrylate, ethyl methacrylate, n-butyl acrylate, methyl methacrylate, t-butyl methacrylate, and n-butyl methacrylate), acrylonitriles and methacrylonitriles, styrene and styrene derivatives, acrylamides and methacrylamides, vinyl ethers, vinyl pyridines, vinyl pyrrolidones, vinyl acetate, vinyl halides (such as vinyl chloride, vinylidene chloride, and vinyl bromide), and dienes (such as ethylene, propylene, 1,3-butadiene, and isobutylene). Acrylates, acrylamides and styrene (and its derivatives) are preferred. Mixtures of the cyanoacrylate polymers may also be used.

In one embodiment, the polycyanoacrylate used in the present invention may include poly(alkyl cyanoacrylates), poly(aryl cyanoacrylates), or poly(alkoxyalkyl cyanoacrylates) wherein an alkyl, aryl or alkoxyalkyl group is present as an ester group. Suitable substituted or unsubstituted alkyl groups may have 1 to 12 carbon atoms and be linear or branched groups. Suitable substituted or unsubstituted aryl groups are carbocyclic aromatic groups having 6 to 10 carbon atoms in the aromatic ring. Suitable substituted or unsubstituted alkoxyalkyl groups may have 2 to 14 carbon atoms and be linear or branched groups. Suitable substituents on these groups may include any monovalent chemical moiety that is not adverse to the desired function of the cyanoacrylate polymer.

Particular polycyanoacrylates suitable for use in the present invention include poly(methyl 2-cyanoacrylate), poly(ethyl 2-cyanoacrylate), poly(methyl 2-cyanoacrylate-co-ethyl 2-cyanoacrylate), poly(methoxyethyl 2-cyanoacrylate), poly(n-butyl 2-cyanoacrylate), poly (phenyl 2-cyanoacrylate), poly(2-ethylhexyl 2-cyanoacrylate), poly(methyl 2-cyanoacrylate-co-methoxyethyl 2-cyanoacrylate-co-ethyl-2-cyanoacrylate), and poly(methyl 2-cyanoacrylate-co-methyl acrylate)(90:10 mol ratio).

Optionally, the top coat layer of the present invention may include a polymeric binder. Suitable binders may be soluble or dispersible in aqueous solutions. Examples of suitable polymeric binders include, but are not limited to, polyvinyl alcohol, polyvinyl pyrrolidones, polyethyleneimine, polyethyloxazoline, polyacrylamide, gelatin, polyacrylic acid, and salts, derivatives and mixtures thereof. In one embodiment, the polymer binder is polyvinyl pyrrolidone.

Further, the top coat layer may also optionally include one or more dispersing agents, humectants, biocides, surfactants, viscosity builders, colorants, pH adjusters, drying agents, defoamers or combinations thereof.

The top coat layer reported above may be applied onto the thermally sensitive layer of a printing plate precursor. The thermally sensitive layer of the present invention may generally include polycyanoacrylate particles and a photothermal conversion material. Suitable polycyanoacrylates include the polycyanoacrylates used in the top coat layer discussed above.

The thermally sensitive layer also includes a photothermal conversion material. Suitable photothermal conversion materials may absorb IR radiation and convert it to heat to affect the solubility of the thermally sensitive composition in a developer. Suitable photothermal conversion materials may include, for example, carbon black, Prussian Blue Paris Blue, Milori Blue, indoaniline dyes, oxonol dyes, cyanine dyes, porphyrin derivatives, anthraquinone dyes, merostyryl dyes, pyrylium compounds, or squarylium derivatives with the appropriate absorption spectrum and solubility. Dyes, especially dyes with a high extinction coefficient in the range of 750 nm to 1200 nm, may be suitable. Suitable absorbing dyes are also disclosed in numerous publications, for example, Nagasaka, EP 0 823 327; U.S. Pat. No. 4,973,572 (DeBoer); U.S. Pat. No. 5,244,771 (Jandrue); and U.S. Pat. No. 5,401,618 (Chapman).

Examples of useful dyes include-2-[2-[2-phenylsulfonyl-3-[2-(1,3-dihydro-1,3,3-trimethyl-2H-indol-2-ylidene)-ethylidene]-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)ethylidene] 1-cyclopenten-1-yl]-ethenyl]-1,3,3-trimethyl-3H-indolium tosylate; 2-[2-[2-chloro-3-[2-ethyl-(3H-benzthiazole-2-ylidene)-ethylidene]-1-cyclohexen-1-yl]-ethenyl]-3-ethyl-benzthiazolium tosylate; and 2-[2-[2-chloro-3-[2-(3-dihydro-1,3,3-trimethyl-2H-indol-2-ylidene)-ethylidene]-1-cyclohexen-1-yl]-ethenyl]-1,3,3-trimethyl-3H-indolium tosylate. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), Particular examples of suitable IR dyes include, but are not limited to, bis(dichlorobenzene-1,2-thiol)nickel(2:1) tetrabutyl ammonium chloride, tetrachlorophthalocyanine aluminum chloride, and the compounds provided in Table 2:

TABLE 1

| IR DYE | STRUCTURE |
| --- | --- |
| IR DYE 1 | 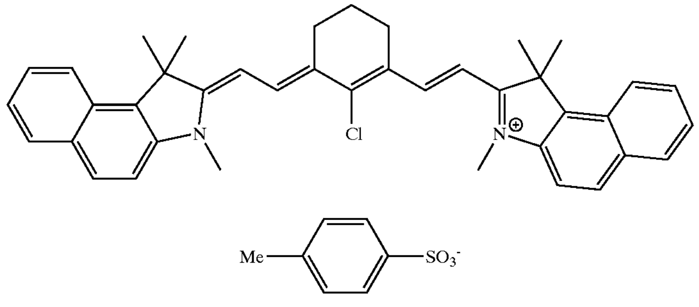 |

TABLE 1-continued
| IR DYE | STRUCTURE |
| --- | --- |
| IR DYE 2 | 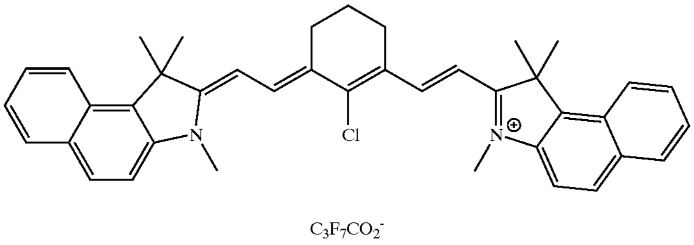 |
| IR DYE 3 | 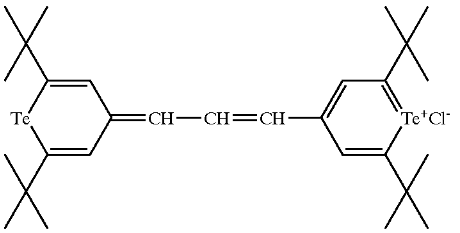 |
| IR DYE 4 | 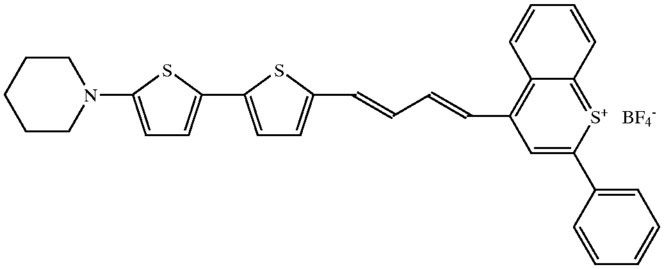 |
| IR DYE 5 | 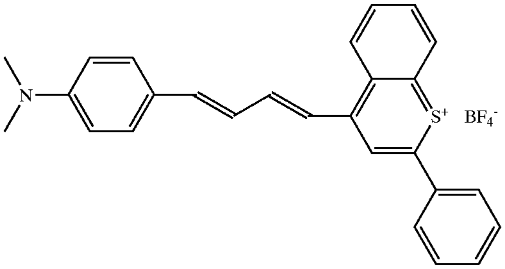 |
| IR DYE 6 | 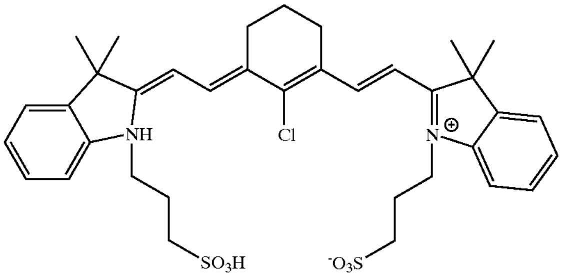 |

TABLE 1-continued
| IR DYE | STRUCTURE |
|---|---|
| IR DYE 7 | 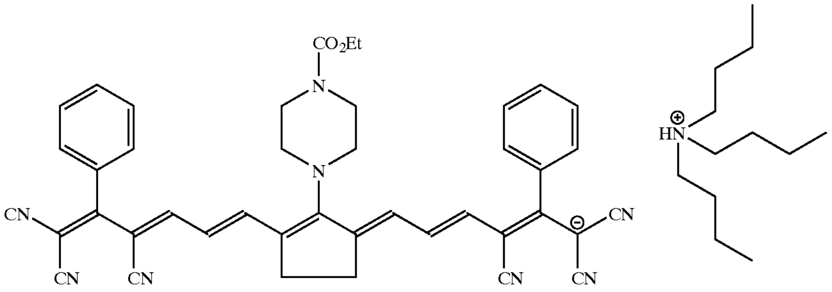 |
| IR DYE 8 | 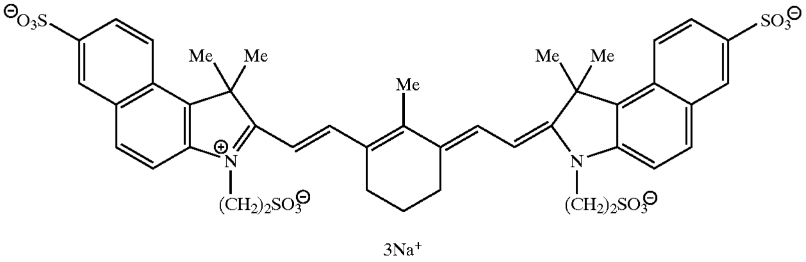 |
| IR DYE 9 | 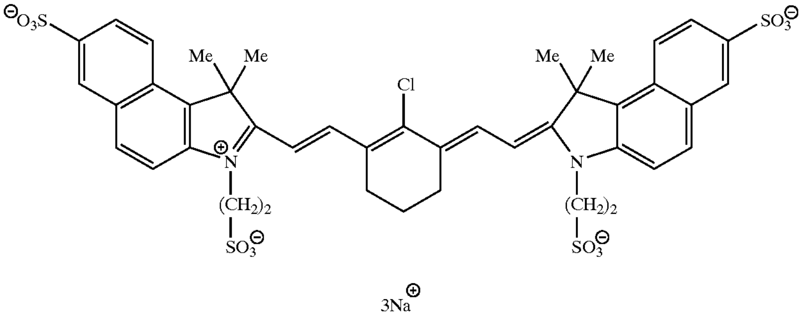 |
| IR DYE 10 | 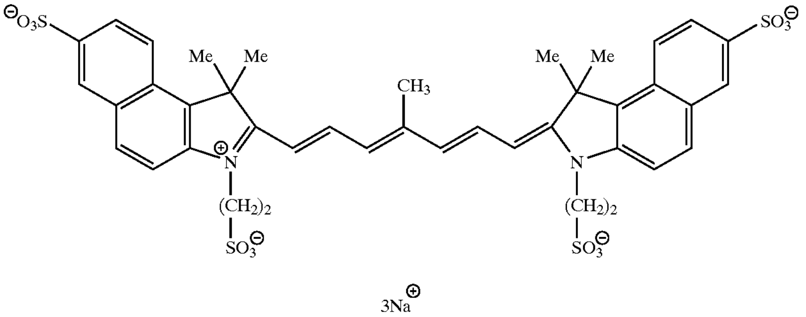 |
| IR DYE 11 | 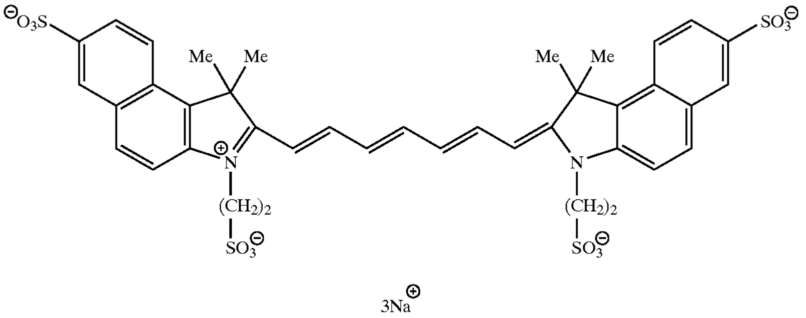 |

TABLE 1-continued

| IR DYE | STRUCTURE |
|---|---|
| IR DYE 12 | 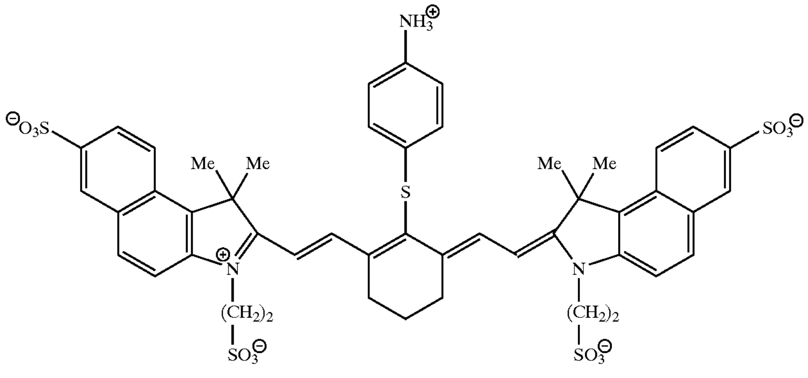 3Na$^+$ |
| IR DYE 13 | 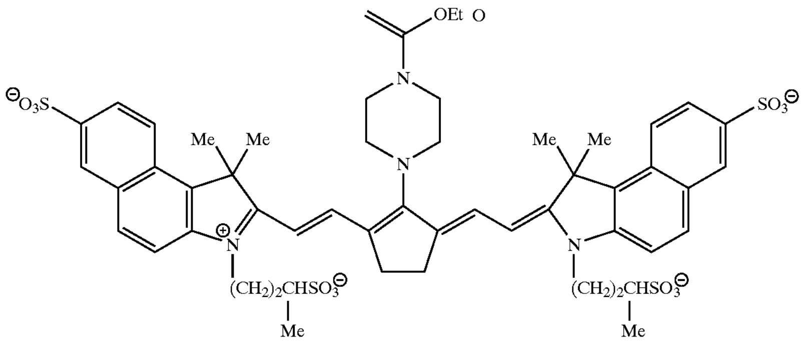 3K$^+$ |
| IR DYE 14 | 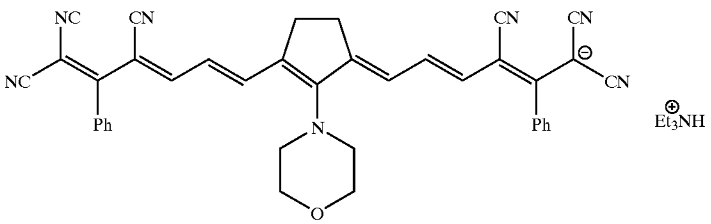 |

IR Dyes 1–7 may be prepared using known procedures or obtained from several commercial sources (for example, Esprit, Sarasota, Fla.). IR dyes 8–14 may also be prepared using known procedures, as described for example in U.S. Pat. No. 4,871,656 (Parton et al.) and reference noted therein (for example, U.S. Pat. No. 2,895,955, U.S. Pat. No. 3,148, 187 and U.S. Pat. No. 3,423,207). Other useful IR dyes are described in U.S. Pat. No. 5,605,780 (Burberry et al.). IR dyes 2 and 14 may be particularly useful because these dyes may reduce or prevent particle agglomeration in solution.

Optionally, the thermally sensitive layer of the present invention may include a polymeric binder. Suitable polymeric binders may be soluble or dispersible in substantially aqueous carriers. Examples of suitable polymeric binders include, but are not limited to, polyvinyl alcohol, polyvinyl pyrrolidones, polyethyleneimine (PEI), polyethyloxazoline, polyacrylamide, gelatin, polyacrylic acid, and salts, derivatives and mixtures thereof.

The thermally sensitive layer may also optionally include one or more additives, including dispersing agents, humectants, biocides, surfactants, viscosity builders, colorants, pH adjusters, drying agents, defoamers or combinations thereof.

The polycyanoacrylate particles useful in both the thermally sensitive layer and the top coat layer of this invention may be readily prepared by optimizing known polymerization techniques and commonly available starting materials and reagents. For example, polymerization may be initiated by combining suitable cyanoacrylate monomers, available from Loctite Corp., Rocky Hill, Conn., with water, glacial acetic acid and a surfactant such as benzene dodecyl sulfonate to form a latex. Suitable cyanoacrylate monomers include, for example, ethyl-2-cyanoacrylate, methyl-2-cyanoacrylate and mixtures thereof, as well as monomers of other polymers reported herein. In one embodiment, the monomer mixture is Loctite 85, an 80% methyl-2-cyanoacrylate and 20% ethyl-2-cyanoacrylate monomer mixture available from Loctite Corp. In another embodiment, the monomer mixture may be a mixture of 80 parts Loctite 493 (methyl-2-cyanoacrylate) and about 20 parts Loctite 420 (ethyl-2-cyanoacrylate). Particle size may be varied, for example, by altering the amount of surfactant added to the latex, or by varying the amount of heat added to the reaction. Optionally, high shear stirring may assist in providing suitably sized polymeric particles. In yet another embodiment, polycyanoacrylate particles may be formed by charging a flask with a solution of Aerosol OT surfactant (available from Cytec West Paterson, N.J., USA) ethyl acetate and a suitable cyanoacrylate monomer, and then adding a solution of triethyl amine in ethyl acetate.

In one embodiment, the polycyanoacrylate particles used in either or both of the topcoat layer and the thermally sensitive layer may be optimized to provide substantially improved plate properties. For example, the polycyanoacrylate particles of the top coat layer may have a major dimension between about 10 nm and 600 nm. The polycyanoacrylate particles of the thermally sensitive layer may have a major dimension between about 50 and about 500 nm, more particularly between 50 and 400 nm. Further, the polycyanoacrylate particles either or both layers may have a mean major dimension of not greater than 350 nm.

As exemplified in the Examples below, the addition of the topcoat layer reported herein further improves ablation of the printing plate precursor during imaging as compared to printing plate precursors having no top coat layer, as well as several conventional top coat layers. However, the top coat layer does not adversely interact with the thermally sensitive layer and consequently, has no substantial adverse effect on printing quality.

Suitable substrates for the present invention may vary widely depending upon the desired application and the specific composition employed. Suitable substrates or substrate surfaces may be oleophilic, and may be composed of metals, polymers, ceramics, stiff papers, or laminates or composites of these materials. Suitable metal substrates include aluminum, zinc, titanium and alloys thereof. In one embodiment, the substrate includes aluminum, which may be treated by graining and anodizing and may then be conditioned to produce an oleophilic surface. Suitable polymeric supports may include polyethylene terephthalate films, polyester layers. The surface of these polymeric substrates may be treated to increase the ink-receptive characteristics of the plate. The substrate may be of sufficient thickness to sustain the wear from printing or other desired applications, and be thin enough to wrap around a printing form, typically from about 100 to about 600 μm.

Specific examples of suitable substrates and substrate treatments are provided in Table 1 below:

TABLE 2

| SUBSTRATE | SURFACE TREATMENT | INTERLAYER TREATMENT |
|---|---|---|
| AA | Quartz Grained and Anodized | None |
| EG-PVPA | Electrograined and Anodized | Polyvinyl phosphonic acid |
| PF | Electrograined and Anodized | Sodium dihydrogen phosphate/Sodium fluoride |
| G20 | Electrograined and Anodized | Vinylphosphonic acid/acrylamide copolymer |
| EG-Sil | Electrograined and Anodized | Sodium Silicate |
| DS-Sil | Chemically Grained and Anodized | Sodium Silicate |
| PG-Sil | Pumice Grained and Anodized | Sodium Silicate |
| CHB-Sil | Chemically Grained, Anodized and Silicated | Sodium Silicate |

In Table 1 above, the abbreviation "AA" refers to "as anodized." An aluminum surface is quartz grained and then anodized using DC current of about 8 A/cm$^2$ for 30 seconds in a 3 Molar $H_2SO_4$ (280 g/liter) solution at 30° C.

"EG" refers to electrolytic graining. The aluminum surface is first degreased, etched and subjected to a desmut step (removal of reaction products of aluminum and the etchant). The plate is then electrolytically grained using an AC current of 30–60 A/cm$^2$ in a 0.3 Molar HCl solution for 30 seconds at 25° C., followed by a post-etching alkaline wash and a desmut step. The grained plate is then anodized using DC current of about 8 A/cm$^2$ for 30 seconds in a 3 Molar $H_2SO_4$ solution (280 g/liter) at 30° C.

"PVPA" refers to polyvinylphosphonic acid. A plate is immersed in a PVPA solution and then washed with deionized water and dried at room temperature.

"PF" refers to a substrate that has a phosphate fluoride interlayer. The process solution contains sodium dihydrogen phosphate and sodium fluoride. An anodized substrate is treated in the solution at 70° C. for a dwell time of 60 seconds, followed by a water rinse and drying. The sodium dihydrogen phosphate and sodium fluoride are deposited as a layer to provide a surface coverage of about 500 mg/m$^2$.

"G20" is a printing plate substrate described in U.S. Pat. No. 5,368,974, which is incorporated herein by reference.

"Sil" refers to an anodized plate is then immersed in a sodium silicate solution to coat it with an interlayer. The coated plate is then rinsed with deionized water and dried at room temperature.

"DS" refers to "double sided smooth." An aluminum oxide plate is degreased, etched or chemically grained, and subjected to a desmut step. The smooth plate is then anodized.

"PG" refers to "pumice grained." The surface of an aluminum substrate is degreased, etched and subjected to a desmut step. The plate is then mechanically grained by subjecting it to a 30% pumice slurry at 30° C., followed by a post-etching step and desmut step. The grained plate is then anodized using DC current of about 8 A/cm$^2$ for 30 seconds in a 3 Molar $H_2SO_4$ solution at 30° C. The anodized plate is then coated with an interlayer of, for example, sodium silicate.

"CHB" refers to chemical graining in a basic solution. After an aluminum substrate is subjected to a matte finishing process, a solution of 1 to 3 Molar NaOH is used during graining at 50° C. to 70° C. for 1 minute. The grained plate is then anodized using DC current of about 8 A/cm$^2$ for 30 seconds in a 3 Molar $H_2SO_4$ solution at 30° C. The anodized plate is then coated with a silicate-based interlayer.

The top coat layer may be applied to the thermally sensitive layer as a top coat coating mixture. Suitable carriers for the coating mixture include carriers that do not adversely interact with the thermally sensitive layer. Suitable carriers include organic carriers such as ethyl acetate and n-heptane. If the top coat layer includes polyvinyl pyrrolidone, the carrier may include an additional solvent such as n-propanol. The type and blend of carrier is important to the application of the top coat layer. For example if too much n-propanol is included, the thermally sensitive layer may be adversely affected. If too little n-propanol is used, the optional binder may not sufficiently dissolve. In one embodiment, the amount of n-propanol is between about 20 and 25 volume percent of the carrier.

The thermally sensitive layer may be applied to the substrate as a thermally sensitive coating mixture. Suitable carriers for the thermally sensitive layer may include both organic and aqueous solvents. More particularly, suitable carriers may include substantially aqueous carriers, including mixtures of water miscible organic liquids in aqueous solutions. A wide range of water miscible organic liquids may be used in the carrier of the present invention. A specific example of a suitable water miscible organic liquid is ethyl acetate.

Suitable proportions of the cyanoacrylate polymer, the photothermal conversion material(s), the optional polymeric binder, and any other optional components may then be combined with the carrier to form the thermally sensitive coating mixture. A dispersing agent such as polyvinyl pyrrolidone may further be included in the coating mixture to reduce or prevent particle agglomeration.

The photothermal conversion material may be optimized to provide an improved thermally sensitive layer. In one embodiment, the photothermal conversion material forms a dispersion (as opposed to dissolving) in the coating mixture. The dispersion may include particles having a mean major dimension of not greater than about 25 nm, more particularly between about 10 and 20 nm. Particles of this size may provide for improved absorption efficiency.

The thermally sensitive coating mixture may be applied onto the substrate by conventional methods, such as by spin coating, bar coating, gravure coating, knife coating or roller coating. The thermally sensitive coating mixture may then be air dried, oven dried or radiation cured to form a thermally sensitive layer. For example, the layer may be heated in an oven at between about 50° C. and about 150° C. for between about 30 seconds and about two minutes. In another example, the layer may be heated at about 80° C. for about 1 minute. The treatment step may remove and/or evaporate portions of the carrier and/or certain optional components, such as the dispersing agent. The top coat coating mixture may then be applied and dried in a similar manner to form a printing plate precursor.

It is important to note that the thermally sensitive layer and the top coat layer may not be entirely discrete layers. That is, some interaction between the layers may occur such that certain components (in addition to the polycyanoacrylate) in the thermally sensitive layer may also be present in the top coat layer. In particular, photothermal conversion material may be present in the top coat layer, particularly portions of the top coat layer in the immediate vicinity of the thermally sensitive layer. Consequently, the top coat layer may absorb some ultraviolet, visible and IR radiation. However, the top coat layer is "substantially free" of photothermal conversion material such that ablation during IR radiation exposure is substantially reduced as compared to printing plate precursors that do not have the top coat layer of the present invention.

The thermally sensitive layer of the resulting printing plate precursor may be imagewise exposed to thermal radiation, particularly to IR radiation, such that portions of the thermally sensitive layer exposed to radiation have a lower developability in fountain solution that unexposed portions. More specifically, the radiation exposed portions adhere more strongly to the substrate such that the exposed portions are less easily developed than unexposed portions. An example of a suitable radiation source is the Creo Trendsetter 3230, which contains a laser diode that emits near infrared radiation at a wavelength of about 830 nm and is available from Creo Products Inc., Burnaby, BC, Canada. Other suitable radiation sources include the Crescent 42T Platesetter, an internal drum platesetter that operates at a wavelength of 1064 nm (Gerber Scientific, South Windsor, Conn., USA), and the Screen PlatRite 4300 series or 8600 series (Screen, Chicago, Ill.). Additional useful radiation sources include direct imaging presses, which are able to image a plate while attached to a printing press cylinder. An example of a suitable direct imaging printing press includes the Heidelberg SM74-DI press, available from Heidelberg, Dayton, Ohio. As further exemplified in the examples below, the presence of the top coat layer reduces ablation during radiation exposure.

Advantageously, the resulting imaged printing plate precursor may then be placed in a conventional printing press without first being subjected to a separate wet processing step using alkaline developers. Instead, the imaged printing plate precursor may be developed "on press" by the fountain solution used in conventional printing presses. Alternatively, in embodiments that utilize direct imaging presses, the printing plate precursor may be mounted on the direct image press, and may then be exposed to infrared radiation and developed.

Suitable fountain solutions for developing the imaged printing plate precursor include substantially aqueous solvents, which may be alkaline, neutral or acidic. Suitable materials that may be added to the aqueous solution include a variety of alcohols and alcohol replacements. Specific examples of suitable fountain solutions include mixtures of the following components in water:

Varn Litho Etch 142W+Varn PAR (alcohol sub) @ 3 oz/gal each (Vam International, Addison, Ill.);

Varn Crystal 2500 (1-step) @ 4.5 oz/gal (Varn International);

Varn Total Chromefree (@ 3.2 oz/gal) (Vam International)+Anchor ARS-F (@ 1.2 oz/gal) (Anchor, Orange Park, Fla.);

Anchor Emerald JRZ (3 oz/gal)+Anchor ARS-ML (3.5 oz/gal) (Anchor);

Rosos Plain KSP (@ 3–4 oz/gal)+Varn PAR @ 3 oz/gal each (Rosos Research Laboratories, Inc.);

Rosos KSP 500 (@ 5 oz/gal)+RV1000 (@ 4 oz/gal) (Rosos Research Laboratories, Inc.);

Prisco 3451 U (@ 4 oz/gal)+Alkaless 3000 (@ 3 oz/gal) (Prisco, Newark, N.J.);

Prisco 4451 FK (@ 3 oz/gal)+Alkaless 6000 (@ 2 oz/gal) (Prisco);

Prisco Webfount 300 (@ 2 oz/gal)+Alkaless 6000 (@ 3 oz/gal) (Prisco);

Rycoline Green Diamond 25 ITW (@ 3 oz/gal)+Rycoline Green Diamond alcohol replacer (@ 2 oz/gal) (Rycoline, Chicago, Ill.);

Allied PressControl EWS (@ 5 oz/gal)+HydroPlus (@ 1.5 oz/gal) (Allied Pressroom Chemistry, Hollywood, Fla.);

RBP 910H (@ 3 oz/gal)+Aquanol 600 (@ 2 oz/gal) (RBP Chemical Technology, Milwaukee, Wis.);

Allied Compliance FS (@ 3 oz/gal)+HydroDyne (@ 3 oz/gal) (Allied Pressroom Chemicals);

The areas of the thermally sensitive layer not exposed to thermal radiation and portions of the top coat layer are removed after being contacted with fountain solution as part of the normal printing process, while radiation exposed areas of the thermally sensitive layer remain adhered to the support to form an ink receptive image area. Due to the aforementioned interaction between the two layers, portions of the top coat layer that are exposed to thermal radiation may also become less soluble in fountain solution than unexposed portions. Thus, the image area may also include portions of the top coat layer. This, however, does not have an adverse effect on the image quality or printing performance of the plate.

Ink applied to the image area may be imagewise transferred to a suitable receiving material (such as cloth, paper, metal, glass or plastic) to provide one or more desired impressions. If desired, an intermediate blanket roller can be used to transfer the ink from the printing plate to the receiving material. The printing plate may be cleaned between impressions, if desired, using conventional cleaning methods.

The present invention is further described by the following Examples.

EXAMPLE 1

Preparation Of Thermally Sensitive Layer

A polycyanoacrylate latex was formed by combining distilled water (1370 g), glacial acetic acid (0.8 g) and sodium benzene dodecyl sulfonate (1.5 g), both available from Aldrich Chemical, Milwaukee, Wis., in a 4 liter flask. After the sodium benzene dodecyl sulfonate dissolved in the water, a mixture of Loctite 85 cyanoacrylate monomer (155 g) and glacial acetic acid (0.8 g) was added dropwise over 5 minutes. Loctite 85 is available from Loctite Corp., Rocky Hill, Conn. and contains 80% methyl-2-cyanoacrylate monomers and 20% ethyl-2-cyanoacrylate monomers. A mildly exothermic polymerization occurred. The solution was heated to between 70 and 75° C. for 10 minutes and then cooled. The solution was then passed through a gauze filter, available from Great Lakes Filter Media, Detroit, Mich.

Particle size analysis using an ultrafine particle analyzer (UPA150) available from Microtrac, Inc., North Largo, Fla., indicated a particle size range between 50 and 500 nm, with major populations at 90 nm and 260 nm, and a mean particle size of about 90 nm.

A coating mixture was then formed by combining the cyanoacrylate particles (76 parts), polyvinyl pyrrolidone binder (18 parts) and IR dye 14 (6 parts) in water. IR dye 14 is represented by the formula:

IR Dye 14

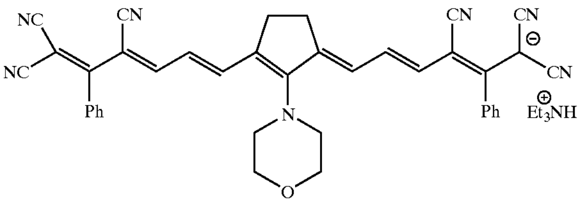

Prior to being added to the coating mixture, IR dye 14 was pre-milled by blending the dye (5 parts) with water (95 parts) and Olin 10G (0.75 parts). Olin 10G is a nonylphenoxypoly (glycidol) surfactant, CIN 10040914, available from Arch Chemicals, Norwalk, Conn. This dye blend was then combined with zirconia stabilized glass beads (1.8 mm in diameter) in a ratio of 313 ml of beads to 125 g of dye blend. The dye blend and the beads were then loaded into a 625 ml glass jar and spun at 83 ft/min for 7 to 10 days (depending on the results of periodic particle size analysis) until substantial portions of the dye particles had a major dimension between 10 and 20 nm.

The thermally sensitive coating mixture was then applied to a grained and anodized aluminum substrate and then dried to form a thermally sensitive layer having a dry weight of 1.0 $g/m^2$.

Preparation of Top Coat Layer

A flask was charged with a solution of Aerosol OT surfactant (5.2 g) (available from Cytec West Paterson, N.J., USA) ethyl acetate (1750 g) and Loctite 85 cyanoacrylate monomer (60 g). Polymerization was initiated by adding 0.30 g of a triethyl amine solution (0.125 g TEA in 10 ml of ethyl acetate). The resulting polymerization was mildly exothermic. After 20 minutes, an additional 60 g of monomer was added in three increments over about 30 minutes.

Particle size analysis using the UPA of Example 1 indicated a particle size range between 30 and 580 nm, with a median particle size of 61 nm. The top coat coating mixture was then applied to the thermally sensitive layer and dried to form a top coat layer having a dry weight of 1.0 $g/m^2$.

The resulting printing plate precursor was then imagewise exposed in a series of exposures at between about 150 and 300 $mJ/cm^2$ (at intervals of 50) using an internal test pattern on a Creo Trendsetter 3230, a platesetter operating at a wavelength of 830 nm and available from Creo Products Inc., Burnaby, BC, Canada. Samples of the resulting imaged printing plate precursor were then mounted on an AB Dick duplicator press and a Komori press (Model S-26) to determine press performance.

As illustrated in FIGS. 1*a–c*, SEM analysis indicates that printing plates formed according to Example 1 possessed an even coating with no uncoated areas. Additionally, a sample of a printing plate precursor formed according to Example 1 was tested for ablation using a PET film, as well as gravimetric tests before and after imaging (at an imaging density of 400 $mJ/cm^2$) to determine loss of coating due to ablation. The PET test revealed only a finite level of ablation. Gravimetric testing indicated that the sample exhibited a coating loss of only 16 $mg/m^2$, or about 1.2% weight loss of the total dry coating weight.

COMPARATIVE EXAMPLE 2

A thermally sensitive layer was formed on a grained and anodized aluminum substrate as in Example 1, except that the dry weight of the layer was 2.0 $g/m^2$. No top coat layer was applied. The resulting printing plate precursor was then imagewise exposed as in Example 1. Samples of the resulting imaged printing plate precursor were then mounted on an AB Dick duplicator press and a Komori press (Model S-26) to determine press performance.

Ablation was measured by visual examination of a PET screen mounted in the Creo Trendsetter. Visual examination indicated a finite level of ablation. However, the thick layer exhibited poor image adhesion, which washed off during on-press development. Thus, a single "thick" layer of thermally sensitive material did not perform as well as the printing plate formed according to Example 1.

COMPARATIVE EXAMPLE 3

A thermally sensitive layer was formed on a grained and anodized aluminum substrate as in Example 1, with a dry weight of 1.0 $g/m^2$. No top coat layer was applied. The resulting printing plate precursor was then imagewise exposed as in Example 1. Samples of the resulting imaged printing plate precursor were then mounted on an AB Dick duplicator press and a Komori press (Model S-26) to determine press performance.

A sample of this "thin" printing plate precursor was tested for ablation using a PET film as well as gravimetric tests before and after imaging at an imaging density of 350 $mJ/cm^2$. Although the PET test exhibited finite ablation, the gravimetric tests revealed a coating loss of 116 $mg/m^2$, or about 13.0% weight loss of the total dry coating weight. Thus, the ablation level of a plate having no top coat layer was higher than the printing plate formed according to Example 1.

COMPARATIVE EXAMPLE 4

The performance of the polycyanoacrylate top coat layer formed as described in Example 1 was compared to several other generally known conventional top coat layers applied onto the thermally sensitive layer formed according to Example 1. The top coat materials and respective performance results are described in Table 3 below. Unless indicated otherwise ablation was measured by visual transfer of ablated material to a PET screen.

TABLE 3

| Topcoat Material | Solvent | Ablation | Print Performance |
|---|---|---|---|
| Polyvinyl alcohol | Water | Finite level of ablation (PET Test) | base coat washed off |
| Polyvinyl pyrrolidone (PVP K-15) | Water | Finite level of ablation (PET Test) | base coat washed off |
| PVP/Vinyl acetate copolymer | Ethyl acetate + n-Propanol (19:1) | Visible level of ablation (PET Test) | image washed off, background scumming occurred |
| Polyethyl oxazoline | Ethyl acetate | Finite level of ablation (PET Test) | poor development of top coat and background scumming occurred |
| Polycyano-acrylate particles | Ethyl acetate | Finite level of ablation (PET Test) | Satisfactory |
| Polycyano-acrylate particles + PVP | Ethyl acetate and n-propanol (80:20) | Finite level of ablation (PET Test); 16 $mg/m^2$ (1.2% of dry weight of coating) loss due to ablation (Gravimetric Test) | Satisfactory |

All of the topcoat layers were coated by Meyer Bar coating. The thermally sensitive layer and the topcoat layer each possessed a dry weight of 1.0 $g/m^2$.

The polyvinyl alcohol was Mowiol 3-83 available from Clariant Corporation, Charlotte, N.C. The polyvinyl pyrrolidone (PVP K-15) was supplied by International Specialty Products, Wayne, N.J. The vinyl acetate was S-630 available from International Specialty products. The polyethyl oxazoline had a molecular weight of 500,000 as supplied by Aldrich Chemical, Miwaukee, Wis.

As demonstrated by the examples summarized in Table 3, the printing plate precursor having a top coat layer including polycyanoacrylate particles exhibited finite ablation and satisfactory print performance. Additionally, the printing plate precursor having a top coat layer including polycyanoacrylate particles and a PVP binder exhibited a finite level of ablation using the PET test and only 16 $mg/m^2$ coating loss using the gravimetric test. Furthermore, this printing plate precursor exhibited satisfactory on-press performance. In comparison, the conventionally known top coat layers that were tested (i.e. polyvinyl alcohol, PVP, PVP/vinyl acetate, and polyethyl oxazoline), either exhibited visible levels of ablation, and/or unsatisfactory printing performance.

We claim:

1. A top coat layer for application onto a thermally sensitive layer of a printing plate precursor, the top coat layer being substantially free of photothermal conversion material and comprising polycyanoacrylate particles.

2. The top coat layer of claim 1 wherein the polycyanoacrylate particles have a major dimension between about 10 and about 600 nm.

3. The top coat layer of claim 1 wherein the polycyanoacrylate particles have a mean major dimension of less than about 350 nm.

4. The top coat layer of claim 1 further comprising a polymeric binder.

5. The top coat layer of claim 4 wherein the polymer binder comprises polyvinyl pyrrolidone.

6. The top coat layer of claim 1 wherein the polycyanoacrylate particles comprise poly(alkyl cyanoacrylate), poly(aryl cyanoacrylate), poly(alkoxyalkyl cyanoacrylate) or mixtures or derivatives thereof.

7. The top coat layer of claim 1 wherein the polycyanoacrylate particles comprise poly(methyl cyanoacrylate), poly(ethyl cyanoacrylate), poly(methyl cyanoacrylate-co-ethyl cyanoacrylate), poly(methoxyethyl cyanoacrylate), poly(n-butyl cyanoacrylate), poly(phenyl cyanoacrylate), poly(2-ethylhexyl cyanoacrylate), poly(methyl 2-cyanoacrylate-co-methoxyethyl 2-cyanoacrylate-co-ethyl-2-cyanoacrylate), poly(methyl 2-cyanoacrylate-co-methyl acrylate), or mixtures or derivatives thereof.

8. The printing plate precursor of claim 1 wherein the polycyanoacrylate particles comprise a copolymer including units derived from at least one cyanoacrylate polymerizable monomer and units derived from at least one non-cyanoacrylate monomer, wherein the units derived from the at least one cyanoacrylate polymerizable monomer comprise at least 50 mol % of the total units in the copolymer.

9. The top coat layer of claim 1 wherein the polycyanoacrylate particles comprise a copolymer derived from units of methyl-2-cyanoacrylate and units of ethyl-2-cyanoacrylate.

10. The top coat layer of claim 1 wherein the topcoat layer has a dry weight of between about 0.25 and about 2.5 $g/m^2$.

11. The top coat layer of claim 1 wherein the topcoat layer has a dry weight of between about 0.5 and about 1.5 $g/m^2$.

12. A printing plate precursor comprising:

a substrate;

a thermally sensitive layer applied onto a surface of the substrate, the layer comprising polycyanoacrylate particles and a photothermal conversion material; and a top coat layer which is substantially free of photothermal conversion material and which comprises polycyanoacrylate particles.

13. The printing plate precursor of claim 12 wherein the polycyanoacrylate particles of the thermally sensitive layer have a major dimension between about 50 and about 500 nm, wherein the particles have a mean major dimension of no greater than 350 nm.

14. The printing plate precursor of claim 12 wherein the polycyanoacrylate particles of the topcoat layer have a major dimension between about 10 and about 600 nm.

15. The printing plate precursor of claim 12 wherein the polycyanoacrylate particles of the thermally sensitive layer have a major dimension between about 50 and about 500 nm, and a mean major dimension of no greater than 350 nm, and the polycyanoacrylate particles of the topcoat layer have a major dimension between about 10 and about 600 nm.

16. The printing plate precursor of claim 12 wherein the thermally sensitive layer has a thickness between about 0.5 to about 1.5 $g/m^2$ and the top coat layer has a thickness between about 0.5 and about 1.5 $g/m^2$.

17. The printing plate precursor of claim 12 wherein the polycyanoacrylate particles in the thermally sensitive layer comprise poly(alkyl cyanoacrylate), poly(aryl cyanoacrylate), poly(alkoxyalkyl cyanoacrylate) or mixtures or derivatives thereof.

18. The printing plate precursor of claim 12 wherein the polycyanoacrylate particles in the thermally sensitive layer comprise poly(methyl cyanoacrylate), poly(ethyl cyanoacrylate), poly(methyl cyanoacrylate-co-ethyl cyanoacrylate), poly(methoxyethyl cyanoacrylate), poly(n-butyl cyanoacrylate), poly(phenyl cyanoacrylate), poly(2-ethylhexyl cyanoacrylate), poly(methyl 2-cyanoacrylate-co-methoxyethyl 2-cyanoacrylate-co-ethyl-2-cyanoacrylate), poly(methyl 2-cyanoacrylate-co-methyl acrylate), or mixtures or derivatives thereof.

19. The printing plate precursor of claim 12 wherein the polycyanoacrylate particles of the thermally sensitive layer are a copolymer comprising units derived from at least one cyanoacrylate polymerizable monomer and units derived from at least one non-cyanoacrylate monomer, wherein the units derived from the at least one cyanoacrylate polymerizable monomer comprises at least 50 mol % of the total units in the copolymer.

20. The printing plate precursor of claim 12 wherein the thermally sensitive layer further comprises a polymeric binder.

21. The printing plate precursor of claim 20 wherein the polymeric binder comprises polyvinyl alcohol, polyvinyl pyrrolidone, polyethyleneimine, polyethyloxazoline, polyacrylamide, gelatin, polyacrylic acid, mixtures thereof or derivatives thereof.

22. The printing plate precursor of claim 12 wherein the photothermal conversion material comprises a dye or a pigment.

23. The printing plate precursor of claim 12 wherein the photothermal conversion material comprises carbon black, Prussia Blue, Paris Blue, Milori Blue, or a cyanine dye.

24. The printing plate precursor of claim 12 wherein the photothermal conversion material comprises bis (dichlorobenzene-1,2-thiol)nickel(2:1)tetrabutyl ammonium chloride, tetrachlorophthalocyanine aluminum chloride, or a compound represented by the formulas:

IR Dye 1

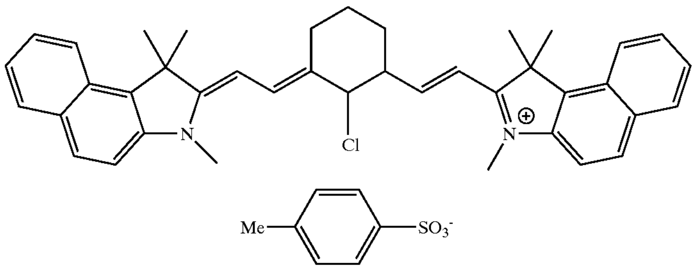

IR Dye 2

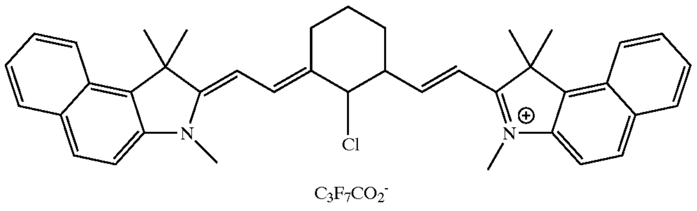

IR Dye 3

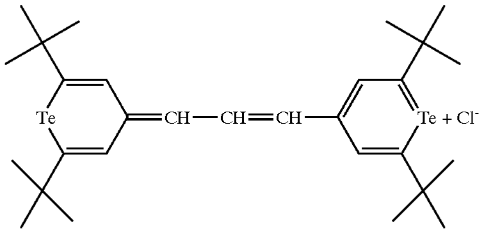

IR Dye 4

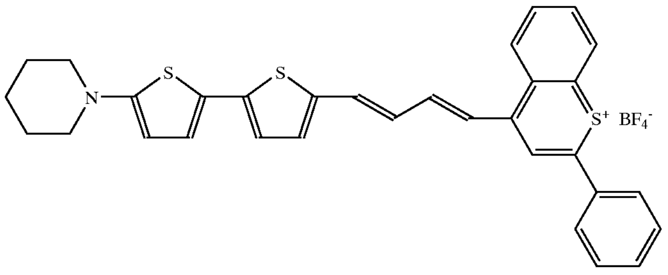

-continued
IR Dye 5
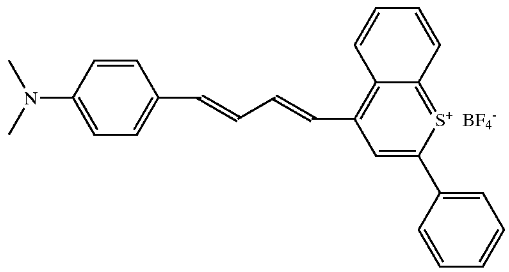
IR Dye 6
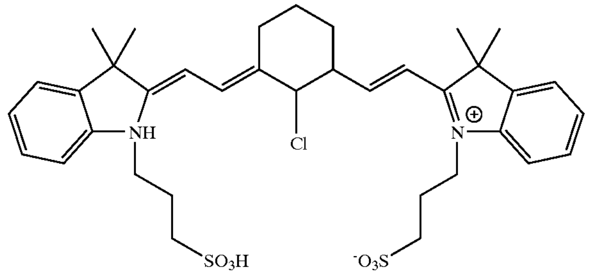
IR Dye 7
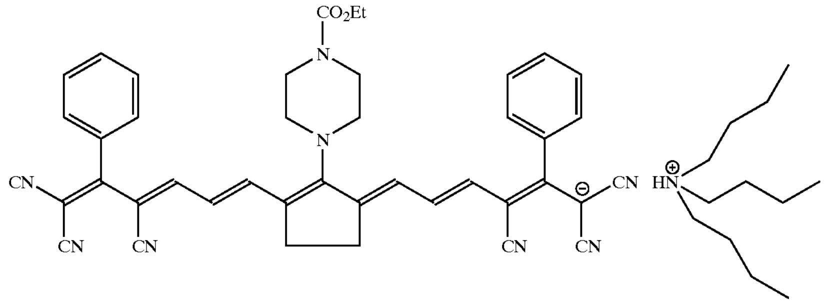
IR Dye 8
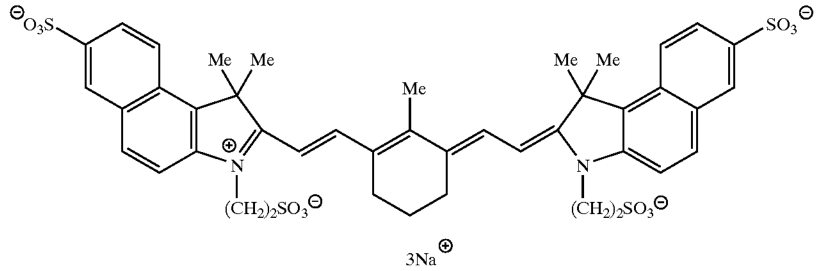
IR Dye 9
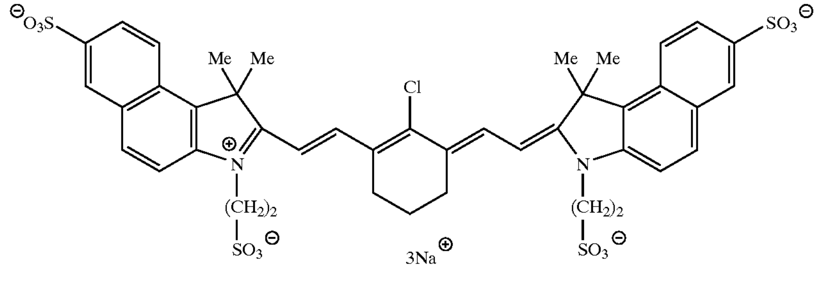

-continued
IR Dye 10
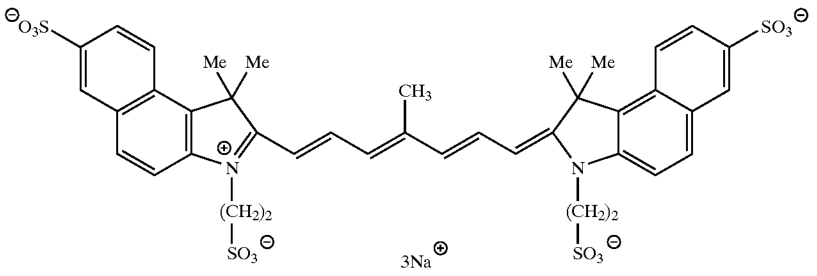
IR Dye 11
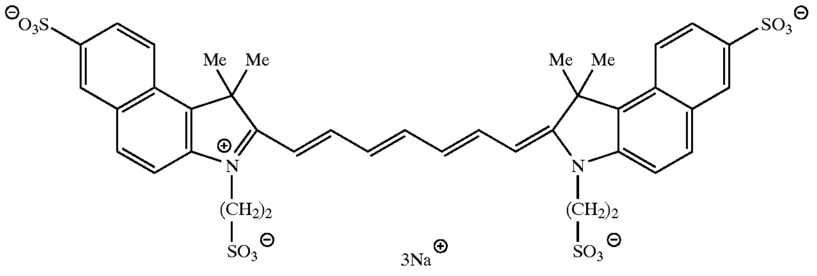
IR Dye 12
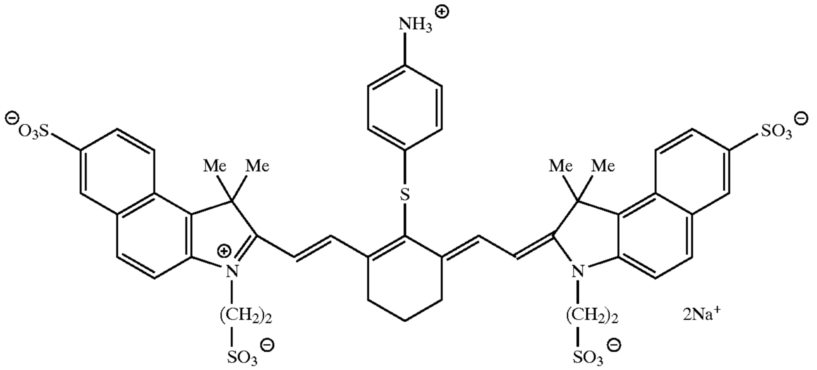
IR Dye 13
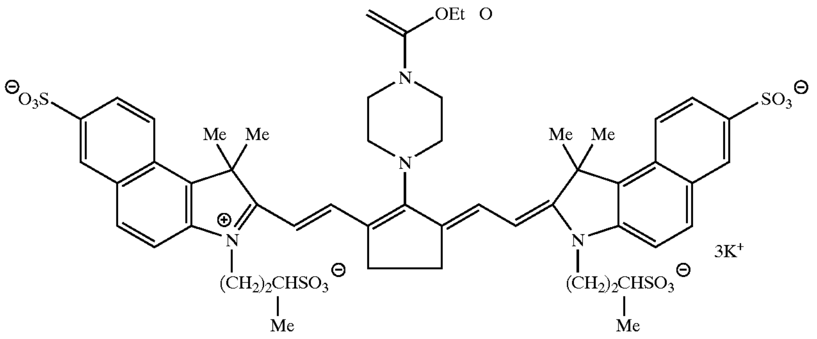
IR Dye 14
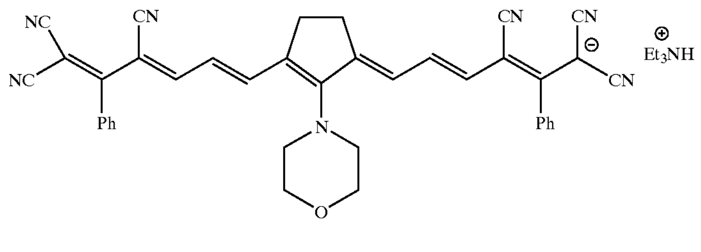

25. The printing plate precursor of claim 12 wherein the photothermal conversion material is a compound represented by the formulas:

IR Dye 2

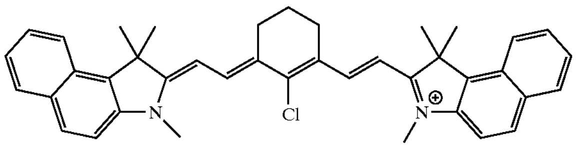

$C_3F_7CO_2^-$

IR Dye 14

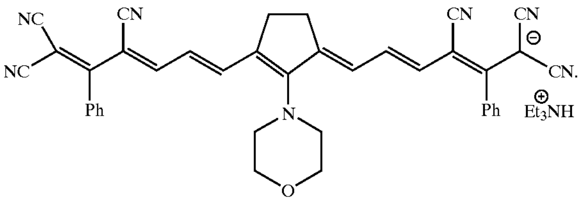

26. The printing plate precursor of claim 12 wherein the photothermal conversion material consists essentially of particles having a major dimension of no greater than 25 nm.

27. The printing plate precursor of claim 12 wherein the photothermal conversion material consists essentially of particles having a major dimension between about 10 and about 20 nm.

28. The printing plate precursor of claim 12 wherein the substrate is hydrophilic.

29. The printing plate precursor of claim 12 wherein the substrate comprises an aluminum substrate.

30. The printing plate precursor of claim 12 wherein the substrate comprises a polymer substrate.

31. The printing plate precursor of claim 12 wherein the substrate comprises a polyester substrate.

32. A method of making a printing plate precursor comprising:

providing a substrate having a thermally sensitive layer thereon comprising polycyanoacrylate particles and a photothermal conversion material;

applying a top coat coating mixture onto the thermally sensitive layer, the top coat coating mixture comprising a mixture of a carrier and polycyanoacrylate polymers, the top coat coating mixture being substantially free of photothermal conversion material; and drying the top coat coating mixture to form a top coat layer on the thermally sensitive layer.

33. The method of claim 32 wherein the carrier comprises ethyl acetate or n-heptane.

34. The method of claim 32 wherein the top coat coating mixture further comprises polyvinyl pyrrolidone.

35. The method of claim 34 wherein the carrier further comprises n-propanol.

36. The method of claim 32 wherein the providing step further comprises applying onto the substrate a thermally sensitive coating mixture comprising a mixture of a carrier, polycyanoacrylate particles and a photothermal conversion material; and drying the thermally sensitive coating mixture to form a thermally sensitive layer on a surface of the substrate.

37. The method of claim 36 wherein the thermally sensitive coating mixture further comprises a hydrophilic binder.

38. The method of claim 36 wherein the thermally sensitive coating mixture further comprises a dispersing agent.

39. The method of claim 38 wherein the dispersing agent comprises polyvinyl pyrrolidone.

40. The method of claim 36 wherein the carrier of the thermally sensitive coating mixture comprises a substantially aqueous carrier.

41. The method of claim 32 further comprising forming an imaged printing plate precursor by imagewise exposing the printing plate precursor to infrared radiation such that exposed portions of the thermally sensitive layer have lower developability in a fountain solution, printing ink or both than unexposed portions of the thermally sensitive layer.

42. The method of claim 41 wherein the thermally sensitive layer is imagewise exposed to radiation after being placed on a direct imaging press.

43. The method of claim 42 wherein, after imagewise exposure, the thermally sensitive layer exposed to fountain solution, printing ink or both, to remove the unexposed portions of the thermally sensitive layer and a portion of the top coat layer.

44. The method of claim 41 further comprising:

mounting the imaged printing plate precursor on a printing press; and exposing the printing plate precursor to fountain solution, printing ink or both, to remove the unexposed portions of the thermally sensitive layer and a portion of the top coat layer.

* * * * *

UNITED STATES PATENT AND TRADEMARK OFFICE

CERTIFICATE OF CORRECTION

PATENT NO. : 6,821,709 B1 
DATED : November 23, 2004
INVENTOR(S) : James Laurence Mulligan et al.

It is certified that error appears in the above-identified patent and that said Letters Patent is hereby corrected as shown below:

Column 22,
Replace figures with

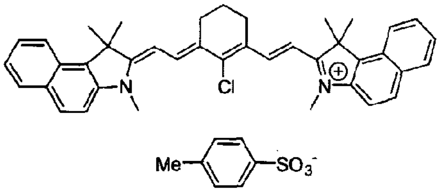

IR Dye 1

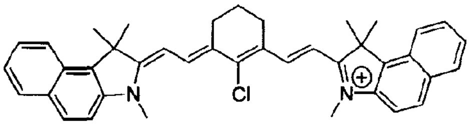

$C_3F_7CO_2^-$

IR Dye 2

Columns 25 and 26,
Replace figure with:

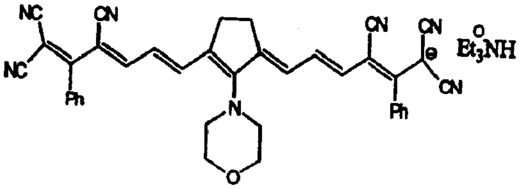

IR Dye 14

Signed and Sealed this

Twelfth Day of April, 2005

JON W. DUDAS
*Director of the United States Patent and Trademark Office*